(12) United States Patent
Biber et al.

(10) Patent No.: US 9,547,064 B2
(45) Date of Patent: Jan. 17, 2017

(54) METHOD FOR THE CONTROL OF A MAGNETIC RESONANCE SYSTEM

(71) Applicants: Stephan Biber, Erlangen (DE); Helmut Greim, Adelsdorf (DE); Juergen Nistler, Erlangen (DE); Thorsten Speckner, Erlangen (DE)

(72) Inventors: Stephan Biber, Erlangen (DE); Helmut Greim, Adelsdorf (DE); Juergen Nistler, Erlangen (DE); Thorsten Speckner, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 1075 days.

(21) Appl. No.: 13/645,093

(22) Filed: Oct. 4, 2012

(65) Prior Publication Data
US 2013/0082707 A1 Apr. 4, 2013

(30) Foreign Application Priority Data
Oct. 4, 2011 (DE) .......................... 10 2011 083 959

(51) Int. Cl.
*G01R 33/54* (2006.01)
*G01R 33/341* (2006.01)
*G01R 33/58* (2006.01)

(52) U.S. Cl.
CPC .......... *G01R 33/583* (2013.01); *G01R 33/341* (2013.01)

(58) Field of Classification Search
CPC .......................... G01R 33/341; G01R 33/583
(Continued)

(56) References Cited

U.S. PATENT DOCUMENTS 7,622,921 B2 11/2009 Fontius et al.
2008/0088305 A1* 4/2008 Olson .................. G01R 33/246
324/309

(Continued)

FOREIGN PATENT DOCUMENTS

CN 101283286 A 10/2008
CN 101644750 A 2/2010
(Continued)

OTHER PUBLICATIONS

Reykowski A. et. al. :"Design of Matching Networks for Low Noise Preamplifiers," in: Magnetic Resonance in Medicine, vol. 33, pp. 848-852, 1995.
(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A method for the control of a magnetic resonance system is provided. In a test phase before a magnetic resonance measurement, a test high-frequency pulse with several parallel individual high-frequency pulses is transmitted with a transmitter antenna arrangement over various different high-frequency transmitter channels. At lower transmitter power, the test high-frequency pulse generates essentially the same field distribution as an excitation high-frequency pulse to be transmitted during a subsequent magnetic resonance measurement. A high-frequency field generated by this test high-frequency pulse is measured in at least one area of a local pulse arrangement, and on the basis of the high-frequency field measured, a high-frequency field value that is to be anticipated at the local coil arrangement during the subsequent magnetic resonance measurement is determined. The control of the magnetic resonance system during a later
(Continued)

magnetic resonance measurement includes taking the high-frequency field value into account.

21 Claims, 4 Drawing Sheets

(58) Field of Classification Search
    USPC .................................. 324/307, 309, 318, 322
    See application file for complete search history.

(56) References Cited

U.S. PATENT DOCUMENTS

| | | |
|---|---|---|
| 2008/0157765 A1 | 7/2008 | Fontius et al. |
| 2008/0265889 A1 | 10/2008 | Zhai et al. |
| 2009/0302845 A1 | 12/2009 | Biber |
| 2009/0322332 A1* | 12/2009 | Cosman ............ G01R 33/3664 324/318 |
| 2010/0033180 A1 | 2/2010 | Biber et al. |
| 2011/0169489 A1 | 7/2011 | Leussler |
| 2012/0013337 A1 | 1/2012 | Graesslin et al. |
| 2012/0161766 A1 | 6/2012 | Harvey et al. |
| 2013/0082707 A1 | 4/2013 | Biber et al. |

FOREIGN PATENT DOCUMENTS

| | | |
|---|---|---|
| DE | 10 2006 061 740 A1 | 7/2008 |
| EP | 0902299 A2 | 3/1999 |
| JP | 2002186595 A | 7/2002 |
| JP | 2009511106 A | 3/2009 |
| JP | 2011098093 A | 5/2011 |
| WO | WO2007042951 A1 | 4/2007 |
| WO | WO 2010/113122 A1 | 10/2010 |
| WO | WO 2011/033402 A1 | 3/2011 |

OTHER PUBLICATIONS

Japanese Office Action for related Japanese Application No. 2012-222462, dated Jul. 14, 2015, with English Translation.
Chinese Office Action for related Chinese Application No. 2012103597547, dated Jun. 2, 2015, with English Translation.
German Office Action dated Jun. 14, 2012 for corresponding German Patent Application No. DE 10 2011 083 959.3 with English translation.
Korean Office action for related Korean Application No. 10 2012 0110195, dated Oct. 27, 2015, with English Translation.
Japanese Grant Decision for related Application No. 2012-222462, dated Mar. 28, 2015.
Korean office Action for related Korean Application No. 10-2012-0110195 dated Mar. 9, 2016.

\* cited by examiner

METHOD FOR THE CONTROL OF A MAGNETIC RESONANCE SYSTEM

This application claims the benefit of DE 10 2011 083 959.3, filed on Oct. 4, 2011, which is hereby incorporated by reference.

BACKGROUND

The present embodiments relate to a method for the control of a magnetic resonance system.

Magnetic resonance tomography is a method that has become widespread for obtaining images of the interior of a body. With this method, the body that is to be examined is subjected to a relatively high basic magnetic field. A high-frequency excitation signal (e.g., the $B_1$ field) is transmitted by a transmitter antenna arrangement, as a result of which the nuclear spins of specific atoms that are resonantly excited by the high-frequency field are tipped through a specific flip angle in relation to the magnetic field lines of the basic magnetic field. The high-frequency signal (e.g., the "magnetic resonance signal"), which is radiated at the relaxation of the nuclear spins, is received by suitable receiver antenna arrangements. The raw data acquired in this way is used to reconstruct the image data. For the purpose of location coding, defined magnetic field gradients are superimposed in each case on the basic magnetic field during the transmitting and reading-out and receiving, respectively, of the high-frequency signals.

For the transmitting of the $B_1$ field, a "whole body coil" (e.g., a "whole body antenna" or "body coil") is permanently integrated in the scanner. The magnetic resonance measurement space is located in the whole body coil. The magnetic resonance measurement space may take the form of a patient tunnel. The antenna arrangements that are used to transmit the $B_1$ field may also be used to receive the magnetic resonance signals.

In order to obtain images with a high signal-to-noise ratio (SNR), the magnetic resonance signals may be recorded with local coils or local coil arrangements including one or more local coils. The local coils or local coil arrangements are antenna systems that are located in the immediate vicinity on or beneath the patient. The signals received by the individual magnetic resonance antenna elements of the local coils, in the form of an induced voltage, are amplified by a low-noise preamplifier, and forwarded by cable to a receiver device of the magnetic resonance system. The signal-to-noise ratio is determined to a decisive degree by the precise structure of the antenna elements of the local coils and, for example, by the losses in the antenna elements. With very small antenna elements, a relatively good SNR may be attained close to the local coil. For this reason, and because of the possibility of accelerated measurement using k-space sub-scanning in parallel imaging processes (e.g., SENSE or GRAPPA), very dense receiver antenna arrangements with a large number of individual channels may be used. The individual antenna elements may have entirely different orientations relative to the transmitted $B_1$ field. In addition to this, for example, to improve the signal-to-noise ratio, even with high-resolution images, high-field systems with 1.5 Tesla to 12 Tesla and more are used.

One problem that arises is that, even during the excitation of the nuclear spins, currents are induced by the high-frequency transmitter power in the antenna elements of the local coils. This may lead to an undesirable heating of the local coils. Accordingly, in order to reduce, when transmitting, the current in the antenna elements, which when receiving, are matched in resonance precisely to the magnetic resonance frequency and consequently also to the frequency (e.g., the Larmor frequency) of the transmitted excitation pulses, the resonance circuit of the antenna elements is opened by a likewise resonant detuning circuit. This is represented diagrammatically in an example in FIG. 1, which shows a magnetic resonance antenna element in a local coil. The antenna element 50 includes a conductor loop 51 that is interrupted at several points by shortening capacitors 52. The induced voltage is tapped using one of the shortening capacitors 52. To do this, the shortening capacitor 52 is bridged in parallel by a high-frequency switch 55 (e.g., in the form of a PIN diode 55) connected in series with an inductor 54. If the high-frequency switch 55 is opened, then the detuning circuit 53 is formed by the shortening capacitor 52 and the inductor 54. The entire magnetic resonance antenna element 50 is detuned in relation to the Larmor frequency. By way of the high-frequency switch 55, via two filter inductors 56 and a filter capacitor 57 connected parallel to the high-frequency switch 55, a tap is effected to a coil plug 58. Using the plug 58, the signal is forwarded to the receiver device of the magnetic resonance system. In the coil plug 58, for example, a pre-processing of the magnetic resonance signal is already integrated (e.g., a suitable pre-amplifier). If the local coil includes several such antenna elements 50, the antenna elements 50 may be compiled, for example, in the coil plug 58, in which the individual signals are then pre-amplified and corresponding individual follow-on spins in the coil plug may be conveyed away via a suitable cable. Using such a connection cable, by the imposition of a direct current, the PIN diode 55 may be switched open in order to detune the antenna element 50. The filter capacitor 57 serves to block off the high-frequency signals from the direct current.

Even with a technically optimum layout of the detuning circuit 53, the high-frequency currents incurred in the detuning circuit, when transmitting the excitation signals through the transmitter antenna system, lead to the heating of the circuit. This heat, by conduction or convection, may also lead to the heating of the surface of the local coil (e.g., the local coil housing). Specified IEC Standards allow for a maximum surface temperature of components that come in contact with the patient of 41° C. This specification is relatively demanding, since both the DC losses of the electronics (e.g., the preamplifier integrated in the coil plug, the frequency mixer, and the analog/digital converter) may contribute to the waste heat, as well as to the high-frequency-induced losses in the detuning circuit. In order to be able to meet this specification, therefore, when transmitting the high-frequency signals for the excitation of the nuclear spins, attention is to be paid not only to the maximum high-frequency load on the patient (e.g., the specific absorption rate (SAR)), but also to providing that the local coils are not overheated. In this respect, appropriate limit values are specified for the transmission of high-frequency pulses, such that these conditions are fulfilled. When local coils are being newly designed, a check is carried out to provide that the temperatures may not be reached when emitting the conventional approved high-frequency pulse sequences.

All-body antennae have been operated in a "homogeneous mode" (e.g., in a "CP mode"), in which the transmitting field is circular polarized and is present in as homogeneous manner as possible inside the patient tunnel. The field structure in this situation is largely determined by the transmitter antenna and the feed from a transmitter, in that a single high-frequency signal is produced with a defined fixed phase and amplitude relationship to all the components of the transmitter antenna. In newer systems, in order, for example, to avoid shadowing effects in the abdomen, two different polarization states may be set (e.g., a circular polarization and an elliptical polarization). The high-frequency distributions are largely homogeneous. In these cases, it is relatively easy to test the local coils and provide that the permissible maximum temperature of 41° C. is not exceeded on the surface of the local coil for the maximum possible mean transmitting fields. The decisive parameter of the transmitting field in this situation is, in addition to the spatial field structure, the "mean ($B_1^2$)" (e.g., the mean square amplitude of the $B_1$ high-frequency field over time). This value is a reference for the power that may be introduced into the local coils by the $B_1$ transmitting field.

Magnetic resonance systems may include the transmitter antenna arrangements with a plurality of independent high-frequency transmitter channels. The individual transmitter channels may be occupied independently of one another by individual HF signals. A high-frequency pulse for the excitation includes several individual high-frequency pulses that are emitted in parallel over the different independent high-frequency transmitter channels and are then superimposed to form one common field. Such a "multi-channel pulse", which, due to the parallel transmission of the individual pulses, is also designated as a "pTX pulse," may be used, for example, as an excitation, refocusing, and/or inversion pulse. An antenna system with several independently controllable antenna components or transmitter channels may also be referred to as a "transmit array," regardless of whether this involves a whole-body antenna or an antenna arrangement close to the body.

With such systems, therefore, the structure or the spatial distribution of the high-frequency field are not specified by the hardware but may be adjusted at will, or at least over broad ranges, by software. Accordingly, the systematic preliminary test of local coils for approval in such magnetic resonance systems may no longer be carried out. A test for all possible transmitting field states may be unattainable. The limit values, with which high-frequency fields are emitted, are thus to be restricted with regard to the temperatures at the local coils to such conservative limit values that, under any circumstances, the possibility of the permissible maximum temperatures being exceeded is excluded. Under certain circumstances, therefore, local coils used previously may no longer be used in newer systems, or are to undergo expensive retro-development and retro-fitting.

SUMMARY AND DESCRIPTION

The present embodiments may obviate one or more of the drawbacks or limitations in the related art. For example, an improved method for the control of a magnetic resonance system is provided.

With the method for controlling such a magnetic resonance system, before a magnetic resonance measurement, in a test phase, a test high-frequency pulse with several parallel individual high-frequency pulses is emitted with a transmitter antenna arrangement via different high-frequency transmitter channels that essentially include the same $B_1$ field distribution as an excitation high-frequency pulse to be emitted during a subsequent magnetic resonance measurement, but with a lower transmitter power than the actual excitation high-frequency pulse during the later magnetic resonance measurement. A high-frequency field produced by the test high-frequency pulse is measured in at least one area of the local coil arrangement (e.g., at one or several locations in the local coil arrangement). On the basis of the high-frequency field measured, a high-frequency field value that is to be anticipated during the later magnetic resonance measurement at the local coil arrangement is determined. The control of the magnetic resonance system may be carried out during a later magnetic resonance measurement by taking account of the high-frequency field value. The production of a field distribution that is "essentially the same" may be that the field distributions, at least discounting some slight tolerances, are identical to the degree for the field distributions to be significant in the induction of the currents into the local coils. The term "excitation high-frequency pulses" may be all the pulses that serve to manipulate the flip angles of the nuclear spins, regardless of whether these involve actual excitation pulses in the narrower sense or refocusing and/or inversion pulses, for example.

The test high-frequency pulse may, for example, correspond precisely to one or more of the high-frequency pulses that are emitted during the later magnetic resonance measurement within a longer high-frequency pulse sequence. "Correspond" may be that essentially the same field distribution is produced but with lower transmitter power.

Such a test high-frequency pulse that, apart from a downward-scaled amplitude, is formed in the same manner as the later actual excitation high-frequency pulse and may therefore also be designated hereinafter as "small signal," may be produced, for example, in that a pulse or pulse sequence is built up digitally by the high-frequency transmitter device in the same manner as with the later magnetic resonance measurement. The pulse or pulse sequence is amplified and transmitted in the usual way. Care is taken, however, to provide that the power amplifier of the transmitter device operates, for example, with an output power of only about −60 to 20 dBm.

The actual magnetic resonance measurement may therefore take place, for example, immediately after this "small signal test measurement." Because the test measurement only requires a few milliseconds, the test measurement is of little significance in the overall measurement time. The measurement may take place under the same conditions, for example, with the patient in the measurement space and with the local coils positioned at the same places as during the later magnetic resonance measurement, such that the patient and the local coil are located in the same position in relation to the transmitter antenna arrangement (e.g., of the transmitting whole-body coil), as during the actual examination. Such a test phase may be carried out beforehand, individually for each special magnetic resonance measurement. Inasmuch as high-frequency pulse sequences that are to be emitted during an examination with several magnetic resonance measurements do not differ very greatly, a joint test phase may be carried out before the overall examination, and all further subsequent magnetic resonance measurements may be controlled based on the high-frequency field value that is thereby determined. For example, the method may include determining the mean ($B_1^2$) dynamically before each measurement, such as the mean would actually occur at the local coil during the subsequent measurement. In any desired transmitting fields (e.g., as may be produced by TX arrays), operation that is safer for the patient may be achieved without the need, for example, for overly-conservative limit values that, under certain circumstances, would lead to poorer image quality or, in isolated cases, to certain measurements not being capable of being carried out at all. The pulse sequences during the magnetic resonance measurements may be built up such that the pulse sequences exploit, in full, the properties of the hardware. Conventional already existing local coils may thus be used in newer devices, and therefore, substantial costs and development effort and expenditure may be saved.

In one embodiment, a control device (e.g., a processor) for controlling a magnetic resonance system with a plurality of independent high-frequency transmitter channels and a local coil arrangement, is configured, in order to carry out a desired magnetic resonance measurement on the basis of a specified control sequence, to emit an excitation pulse (e.g., a multi-channel pulse) with several parallel individual high-frequency pulses over different high-frequency transmitter channels, or to initiate the transmission of such a multi-channel pulse. The control device includes a test unit. The test unit includes a test signal transmission interface that, in a test phase before a magnetic resonance measurement, initiates the transmission of a test high-frequency pulse with several parallel individual high-frequency pulses over the different high-frequency transmitter channels. The test high-frequency pulse, with low transmitter power, produces the same $B_1$ field distribution as an excitation high-frequency pulse to be emitted during a subsequent magnetic resonance measurement. The test unit also includes a test value measurement interface that, in the test phase, initiates the measurement of a high-frequency field generated by the test high-frequency pulse in at least one area of a local coil arrangement. The test value measurement interface also, for example, takes over the test values. The test unit also includes an analysis unit that, on the basis of the high-frequency field measured, calculates a high-frequency field value that is to be anticipated during the later magnetic resonance measurement at the local coil arrangement. The test unit includes a monitoring unit that, for example, by emitting or transferring corresponding control values or by on-line monitoring during the magnetic resonance measurement, arranges for the control of the magnetic resonance system to be carried out during the later magnetic resonance measurement by taking account of the high-frequency field value.

One embodiment of a magnetic resonance system includes, in addition to a basic field magnet system, with which a basic magnetic field is imposed in the usual manner in the patient measurement space, a transmitter antenna system with several independent high-frequency transmitter channels and a gradient system including several gradient coils, and a local coil arrangement. One embodiment of a control device is also provided.

For example, the test unit may also be realized in the form of software on a suitable programmable control device with appropriate storage possibilities. The high-frequency transmitter device, the gradient system interface, and the high-frequency receiver device may also, at least partially, be realized in the form of software units. Other units of these components may be pure hardware units (e.g., the high-frequency amplifier, the high-frequency transmitter device, a gradient pulse generator device of the gradient system interface, and/or an analog/digital converter of the high-frequency receiver device).

A largely software-format realization (e.g., of the test unit) has the advantage that already existing magnetic resonance system control devices may be retrofitted in a simple manner by a software update in order to operate in the manner according to the present embodiment. A computer program product that includes program sections (e.g., instructions) and is, for example, deposited in a transportable memory (e.g., a non-transitory computer-readable storage medium) and/or provided via a network for the transfer (e.g., loaded directly into a memory of a programmable magnetic resonance system control device) in order to carry out all the acts of the method according to the present embodiments when the program is run in the control device, is provided.

Embodiments for one category (e.g., the method) may also be developed in a manner analogous to another category (e.g. the controller). Different features of different embodiments may also be combined to form new exemplary embodiments.

In order to be able to assess the conditions at the local coil, the high-frequency field produced by the test high-frequency pulse is measured, for example, by a number of antenna elements (e.g., one or more, arranged at the local coil arrangement or integrated in the local coil arrangement). There are a number of variants available for this.

In one embodiment, the high-frequency field produced by the test high-frequency pulse is measured directly by a number of magnetic resonance antenna elements of the local coil arrangement. In other words, during the transmission of the test high-frequency pulse, the local coils are deliberately switched to reception, and, by contrast with the time of the transmission of the later excitation high-frequency pulse (or the excitation high-frequency pulse sequence), the local coils are not detuned, as is provided at high transmission amplitudes for the safety of the hardware and the patient. The signal amplitudes received in this situation (e.g., the voltage induced in the magnetic resonance antenna elements) deliver direct information about the $B_1$ field that is present at the individual local coil, at the location of the individual magnetic resonance antenna element in the local coil. In this situation, the voltage signal U measured is scaled with a scaling factor K in order to obtain the actual $B_1$ field present, in accordance with $$B_1 = K \cdot U \qquad (1)$$

This embodiment has the advantage that the method may be carried out with any desired conventional local coils.

In one embodiment, the high-frequency field produced by the test high-frequency pulse may be measured by a number of calibrated test antenna elements (e.g., pick-up probes). The test antenna elements may not be adjusted to be resonant to the magnetic resonance frequency. The conversion of the voltage signals received with such test antenna elements may be carried out by analogy to equation (1), where the resonance deviation may be easily taken into account in an adjusted calibration factor K. The advantage of such test antenna elements lying outside the Larmor frequency resonance is that this also allows for additional signals to be acquired during the later measurement, and for an online check to be used during the transmission in order to produce additional redundant safety factors.

By a measurement of an individual high-frequency pulse, a local maximum high-frequency amplitude field occurring during the pulse may be determined with, for example, Equation (1) described above. This may be converted into the local maximum high-frequency amplitude to be anticipated later during the genuine pulse sequence, as a high-frequency field value, provided that the later power and the transmitter power present during the high-frequency pulse are known. Together with other sequence parameters (e.g., repetition time, pulse duration, pulse form), the maximum high-frequency field amplitude to be anticipated during a complete measurement may be determined, or a quadratic temporally-determined high-frequency field amplitude that is to be anticipated locally (e.g., the desired mean $(B_1^2)$) for a pulse sequence or a complete measurement may be determined.

Provided that the structural design details of the local coil are known, a temperature value that is to be anticipated due to the high-frequency field at and/or in the local coil arrangement may be determined. In addition or alternatively, a maximum voltage value that is to be anticipated due to the high-frequency field at and/or in the local coil arrangement (e.g., the maximum induced electrical voltage at individual components of the local coil) may be determined in order to avoid impermissibly high voltages at components and to protect the components against flashover.

For example, taking account of the high-frequency field value, a physical high-frequency loading value of the object under examination caused by the transmitting field and, for example, an SAR value may be calculated. In addition to the heating of the local coils due to the transmitter power, the patient may be heated, for example, by eddy currents that are induced in the patient by the transmitter field. This leads to a physical high-frequency loading or additional heat loading. The Specific Absorption Rate (SAR) indicates in this situation the heat power in W/kg that is released in the patient (e.g., overall or locally). A number of different regulations (standards) specify limit values for the permissible SAR in different regions of the body. A precise calculation of the SAR value actually applied to the patient requires a precise knowledge of the fields actually present. Since the fields are defined not only by the transmitter antenna but also by the patient and the eddy currents induced in the patient, the method according may also be used to obtain more reliable or more precise values with regard to the physical high-frequency load to be anticipated and, as appropriate, the SAR values desired. In this situation, several different SAR values may be determined and monitored (e.g., different local and global values).

For example, in this situation, a test pulse sequence including several test high-frequency pulses is transmitted in the test phase. The test pulse sequence corresponds to at least one section of a pulse sequence that is to be transmitted in the later magnetic resonance measurements (e.g., apart from the power scaling, essentially accords with this). In other words, for example, when a pulse sequence for a later measurement includes different high-frequency pulses over a run time, the entire sequence or parts of the sequence may be simulated in the small signal before the run takes place. This may take place very rapidly, since the simulation involves a purely high-frequency technical measurement without relaxation times or gradient switching times. Such comprehensive measurements do not need more than a few milliseconds.

The high-frequency field value (e.g., the maximum high-frequency field amplitudes to be anticipated locally), a mean quadratic high-frequency amplitude to be anticipated, and, if appropriate, voltage values and/or temperature values to be anticipated as derived from this, may also be compared in each case with limit values. As a function of the result of the comparison, the later magnetic resonance measurement may be restricted. Such limit values may be deposited, for example, in a coil file (e.g., in a file allocated to the local coil in the control unit of the magnetic resonance system, or in a memory located in the coil). The restriction of the later magnetic resonance measurement may be effected, for example, by the reduction of the pulses and/or also by impeding the transmission of specific pulse frequencies. This is possible in that, for example, the individual sequence parameters may be adapted or by appropriate information being issued to the user, who then prevents the transmission of the pulse sequence or modifies the pulse sequence.

For example, depending on the high-frequency field value and/or the voltage value and/or the temperature value and, as appropriate, the limit value, a pulse sequence for a later magnetic resonance measurement may be determined or modified. The pulse sequence is modified appropriately offline before transmission, or the values go directly into the calculation and optimization of the pulse sequence. In this situation, an item of information may be derived from the measurement of the mean $(B_1^2)$ or other values that also go into later pulse calculations in order, as early as at the calculation of pTX pulses, to organize these such that the limit values of the local coils are not exceeded, and working takes place close to the mean $(B_1^2)$ limit of the local coils without implementing unnecessarily high safety factors.

In order to obtain the correct conversion factor, for a specific local coil, between the received signal and the actual $B_1$ field present (e.g., before a test phase, in a calibration phase), by emitting a calibration high-frequency pulse with known high-frequency field distribution and known power for the antenna elements, calibration values that may be used later for the scaling of the signals are determined in each case. The calibration measurement is not carried out before every magnetic resonance measurement. The calibration measurement may, for example, also be carried out before the use, for the first time, of a local coil on a magnetic resonance system, using phantoms or the like. In this situation, the measurement may not be carried out with a patient. The high-frequency field is to be sufficiently known at each location of the local coil so that the calibration values may be determined with sufficient accuracy. Accordingly, for example, a field that is as homogeneous as possible is emitted in such a calibration phase.

DETAILED DESCRIPTION OF THE DRAWINGS

Figure 1:
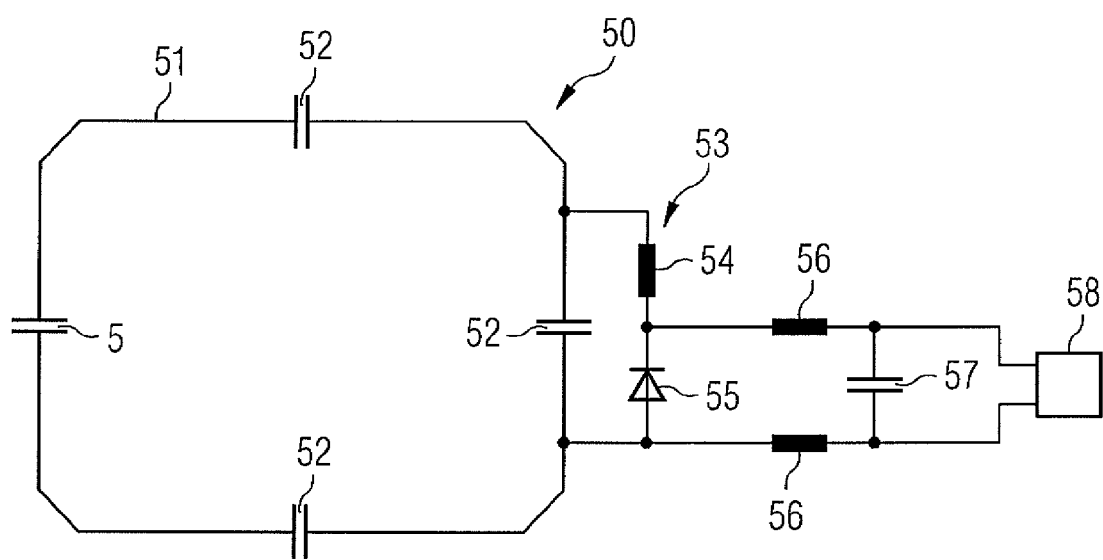
FIG. 1 shows a magnetic resonance antenna element of a local coil according to the prior art.

The magnetic resonance antenna element 50 of a conventional local coil, as represented in FIG. 1, is explained above. Such a conventional local coil may be used in the framework of the present embodiments. Local coils of other structural design may also be used within the framework of the present embodiments.

Figure 2:
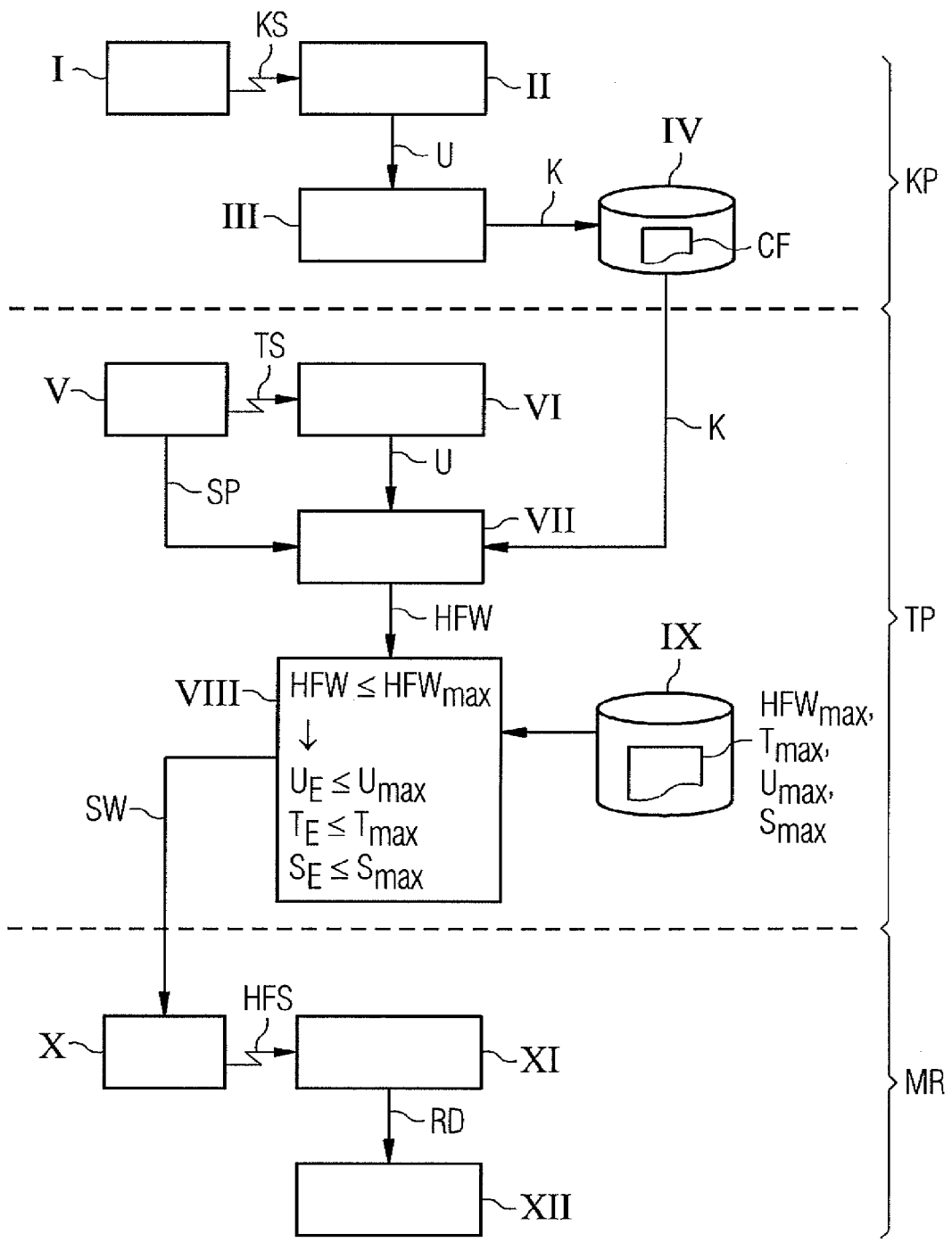
FIG. 2 is a flow diagram of an exemplary sequence of one embodiment of a method for the control of a magnetic resonance system.

FIG. 2 shows a sequence plan as to how one embodiment of a method may be carried out. The method is divided into three phases: a calibration phase KP, a test phase TP, and an actual magnetic resonance measurement MR. The calibration phase KP may be carried out one single time for each local coil in order to obtain the calibration data. The test phase TP may be carried out "online" before each individual magnetic resonance measurement MR in order to determine a mean $(B_1^2)$ field dynamically before each measurement. Alternatively or additionally, after a test phase TP, several magnetic resonance measurements MR of the same nature may be carried out immediately one after the other, without a repeat test phase TP being carried out again for each individual magnetic resonance measurement MR. Different part-magnetic resonance measurements may be tested within the test phase TP, and the corresponding data may be deposited. The data allocated to the individual part measurements may be used in each case in the subsequent genuine measurement. For the sake of simplicity, in FIG. 2 a sequence, in which a magnetic resonance measurement MR takes place immediately after a single test phase for this magnetic resonance measurement MR, is represented.

In FIG. 2, the method begins with act I, in which a homogeneous high-frequency field is transmitted with known power. This signal is designated as calibration signal KS. In act II, the calibration signal KS is received simultaneously by the antenna elements that are intended to serve later for the measurement of the small signal (e.g., the test signal TS). In this situation, this involves, for example, the magnetic resonance antenna elements of the local coils, which receive the magnetic resonance signals from the patient's body. This may also involve test antenna elements.

A voltage signal U received in act II by the individual antenna elements may be used, on the basis of the information relating to the known calibration signal KS that has been transmitted, to determine calibration data K (e.g., a conversion factor between the induced voltage signal received and the high-frequency amplitude transmitted) in accordance with equation (1). The calibration data K (e.g., the scaling factor K) may be deposited in act IV in a memory for the coil, or in a coil file CF. This brings the calibration phase KP to a conclusion.

At any desired time later, the calibration data K may be used in order to carry out the test phase TP before a magnetic resonance measurement MR. The test phase TP begins in act V by the transmission of a test signal TS or, for example, by the transmission of a complete test signal sequence that, apart from reduced power, is, for example, formed in the same way as the later high-frequency pulse sequence HFS that is transmitted during the subsequent magnetic resonance measurement MR.

The test signal TS is measured simultaneously in act VI with the antenna elements (e.g., magnetic resonance antenna elements of the local coil or suitable test antenna elements that are arranged in or at the local coil). The voltages U induced in the antenna elements are converted in act VII with the aid of the calibration values K, which are, for example, again read out of the coil file CF in order to determine the current amplitude of the $B_1$ field. At this point, an upwards scaling of the values received may take place with a power factor, by which the test signal TS was reduced in relation to the high-frequency signal HFS that is to be sent later. In other words, if the power of the test signal TS transmitted corresponds to only 10% of the power of the high-frequency signal HFS to be transmitted later, an upwards scaling by the factor of 10 is to take place. On the basis of a sequence parameter SP such as, for example, repetition times, pulse lengths, or pulse forms that are known from the test signal sequence and are also used during the transmission of the actual pulse sequence during the magnetic resonance measurement MR, further high-frequency field values HFW (e.g., the mean quadratic high-frequency field amplitude (the mean $(B_1^2)$, which represents the high-frequency power received by the antenna over the transmission time) may be determined.

In act VIII, the high-frequency field value HFW that is determined may be compared with a limit value (e.g., a maximum high-frequency field value $HFW_{max}$). The maximum high-frequency field value $HFW_{max}$ may be read out in act IX, for example, from a memory, in which corresponding limit values for the coil are deposited. For example, this may involve the coil file CF. As an alternative, these values may also be deposited in a memory in the local coil.

As an alternative or in addition, the high-frequency field value HFW may also be converted into a temperature value $T_E$ to be anticipated in or at a surface of the local coil, or a maximum induced voltage $U_E$ to be anticipated is determined. A determination of a physical high-frequency load value $S_E$ that is to be anticipated (e.g., an SAR value $S_E$) may be effected. These values $T_E$, $U_E$, $S_E$, may also be compared, for example, with maximum values $U_{max}$, $T_{max}$, $S_{max}$ read out beforehand from a memory in order to check whether the planned pulse sequence may cause the permissible limit values $U_{max}$, $T_{max}$, $S_{max}$, to be exceeded.

Depending on the limit value check in act VIII, suitable control values SW may be produced in order, for example, to indicate to a user that with the desired high-frequency pulse sequence present, the limit values would be exceeded and/or use will be made, for example, directly of the control values SW in order to exert an influence on the calculation and/or the transmission of the later pulse sequence.

This may then be done, for example, with the subsequent magnetic resonance measurement MR in act X, in which the desired high-frequency pulse sequence (e.g., a plurality of desired high-frequency signals or excitation high-frequency pulses HFS) may be transmitted in the planned sequence. On the basis of the control values SW, an intervention may be carried out at any desired point of the magnetic resonance system, such that, for example, excessively high pulse power values of the power amplifier may be throttled, or an influence may be exerted directly on the pulse generation. On the basis of the high-frequency pulses HFS transmitted, the raw data RD is acquired in act XI. The raw data RD is reconstructed in act XII to form image data.

The person skilled in the art is aware of how such a magnetic resonance measurement is carried out in detail by the transmission of high-frequency pulse sequences and suitable gradient pulse sequences, as well as the acquisition of the raw data RD and the various possibilities for the reconstruction of the image data from the raw data RD. This is not elaborated in any greater detail here. All known magnetic resonance recording methods may be used within the framework of the method. The magnetic resonance recording methods differ from one another in that influence may be exerted by suitable control values SW, for example, on the transmission and/or generation of the excitation high-frequency pulses HFS in order to provide that specific limit values are reliably maintained (e.g., specific maximum temperature values $T_{max}$ at the local coils and/or specific maximum permissible voltage values $U_{max}$ at electronic components of the local coils).

Figure 3:
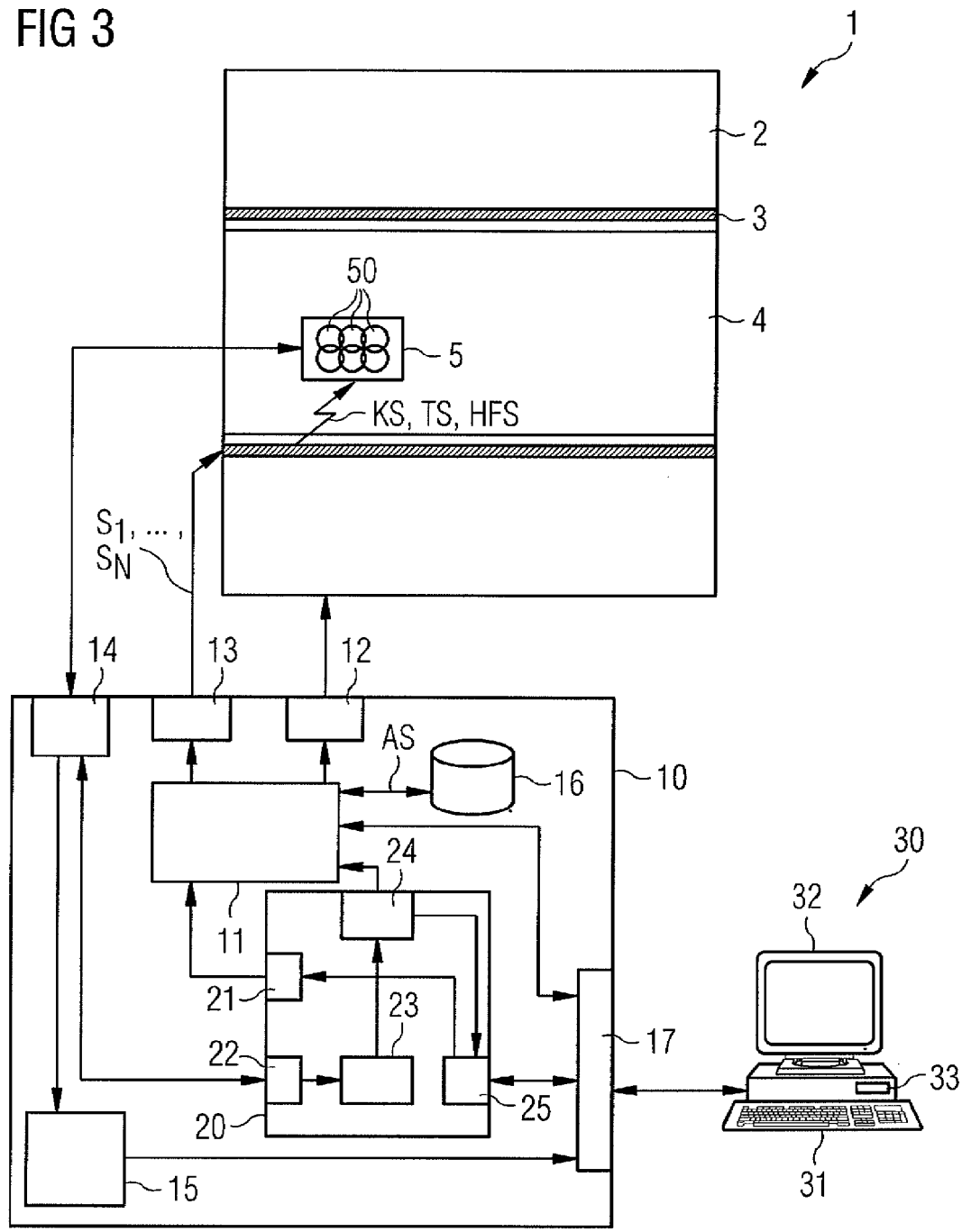
FIG. 3 shows a simplified representation of one embodiment of a magnetic resonance system.

FIG. 3 shows a rough diagrammatic representation of one embodiment of the magnetic resonance system 1.

The magnetic resonance system 1 includes the magnetic resonance scanner unit 2, in which an object to be examined or a patient or test subject (not shown) is laid, during an examination, on a patient bed (not represented) in a magnetic resonance measuring chamber or patient tunnel 4. In the magnetic resonance scanner unit 4, a plurality of components is provided. The components include a basic magnetic field generating unit that provides that a basic magnetic field is present inside the patient tunnel 4, which is as homogeneous as possible. The magnetic resonance scanner unit 2 also includes gradient coils, with which a magnetic field gradient may be imposed in a defined manner inside the patient tunnel 4, as well as a whole-body antenna 3, using which the high-frequency fields may be emitted into the patient tunnel 4. The whole-body antenna 3 includes several separate high-frequency transmitter channels $S_1, \ldots, S_N$, that are controllable separately from one another.

In addition to the components already referred to, the magnetic resonance scanner unit 2 may include a plurality of other components such as, for example, a shim system in order to improve the homogeneity of the basic magnetic field, and a monitoring system for general monitoring tasks.

The scanner unit 2 may be controlled by a control device 10. In principle, such magnetic resonance systems 1 and the control devices 10 relating to the magnetic resonance systems 1 are known to the person skilled in the art, and therefore are not explained in detail.

A large part of the control device 10 represented in FIG. 1 may be realized in the form of software modules on one or more processors inside a housing of the control device 10. Such a control device may include several components or modules arranged spatially separated and networked with one another in a suitable manner.

The control device 10 includes, for example, a plurality of different interfaces (e.g., a terminal interface 17), with which the control device 10 is connected to a terminal 30 for the operator. This terminal 30 includes a user interface (e.g., a keyboard 31), a visual display unit 32, and, if appropriate, a pointer device (e.g., a mouse; not shown), such that the user is also provided with a graphical user interface.

Other interfaces are a high-frequency transmitter device 13 (e.g., an HF transmitter device) that represents the complete high-frequency transmitter branch of the magnetic resonance system 1, and a receiver device 14.

By way of the HF transmitter device 13, for example, the whole-body coil 3 in the scanner unit 2 is controlled, or suitable high-frequency pulse sequences are produced to excite the nuclear spins in the desired manner. To achieve this, the HF transmitter device 13 includes one or more digital pulse generating units and suitable digital/analog converters to produce a digital signal for the pulse form. The HF transmitter device 13 also includes, as mixers, high-frequency amplifiers in order, based on the digital signal, to produce a high-frequency signal (e.g., represented only symbolically in FIG. 3 by a line) for each of the high-frequency transmitter channels $S_1, \ldots, S_N$, of suitable strength, form, and frequency to generate, overall, a multi-channel pulse (pTX pulse) or a sequence of such pulses.

As a further interface, the control device 10 includes a control interface 12 for the other components of the scanner unit 2. Using the control device 10, for example, the gradient coils may be controlled. This may involve several interfaces (e.g., grouped together in FIG. 1 to form an interface block). The control interface 12 and the high-frequency transmitter interface 13 are controlled by a measurement control unit 11 that, in accordance with actuation control sequences AS specified precisely in measurement protocols, provide for the transmitting of the gradient pulse and high-frequency pulse sequences used for a specific magnetic resonance measurement. The measurement protocols may be deposited, for example, in a memory 16, and/or specified or modified by a user by way of the terminal 30.

The HF receiver device 14 is connected to a local coil arrangement 5 that includes several magnetic resonance antenna elements 50. Such a local coil arrangement 5 may also include several individual local coils, for example, that each includes several magnetic resonance antenna elements 50 and are arranged at a patient or test subject positioned in the patient tunnel 4.

For the connection with the individual magnetic resonance antenna elements 50, the HF receiver device 14 includes several reception channels (not represented individually in FIG. 1) (e.g., one reception channel for each of the magnetic resonance antenna elements 5). The reception channels may be structured in the usual manner (e.g., if the magnetic resonance signals are sent in analog form from the local coil 1 to the HF receiver device 14, with a number of different demodulators in order to filter out from the magnetic resonance signals, the information desired in terms of frequency, as well as analog/digital converters in order finally to digitalize the raw data). As an alternative, the analog/digital converters for each MR antenna element may be already arranged in the local coil with newer local coils.

The magnetic resonance signals or raw data RD respectively received by the individual reception channels of the HF receiver device are forwarded to an image reconstruction unit 15 that reconstructs magnetic resonance images from the digitalized raw data in the usual manner. The reconstructed images may, for example, be output via the terminal interface 17 onto a visual display unit 32 of the terminal 30 or deposited in the memory 16. As an alternative, the control device 30 may also include an interface to a network or the like (not shown), such that raw data or image data may be stored, or images and raw data may be transferred to other computers (e.g., findings units for the consideration of the images and printers). The HF receiver device 14 is also controlled by the measurement control unit 11, such that the raw data RD is read out synchronously for the switching of the gradient pulses used for this for the location coding. The magnetic resonance antenna element 50 may be detuned during the transmission of the excitation high-frequency pulses HFS during a magnetic resonance measurement MR. This may be effected by a switchover unit in the HF receiver unit 14, since the local coil arrangement 3 is connected to the HF receiver device 14 by a cable that may also be used to transfer corresponding control signals to the local coil arrangement 5.

In one embodiment, the control device 10 also includes a test unit 20. The test unit 20 includes a test signal transmitter interface 21. The test signal transmitter interface 21 initiates, in a test phase, the transmission of a test signal or test high-frequency pulse TS, in that a corresponding control signal is transferred to the measurement control unit 11. This provides that a corresponding test high-frequency pulse TS with reduced power is transmitted from the HF control device 13. The test unit 20 also includes a test value measurement interface 22. In the test phase, this provides that the high-frequency field created by the test high-frequency pulse TS is measured in at least one area of a local coil arrangement 5. This may be put into effect, for example, by a control command being issued from the test value measurement interface 22 to the switchover unit in the HF receiver device 14, such that, parallel to the transmission of the test high-frequency pulse TS, the individual magnetic resonance antenna elements 50 of the local coil arrangement 5 are not detuned, but remain switched to receive. In addition, the induced voltage that is determined in this situation may be taken over via the test value measurement interface 22 as a measured value. This measured value is transferred to an analysis unit 23 that, on the basis of the measured high-frequency field or voltage value, determines a high-frequency value HFW and, as appropriate, may also determine corresponding temperature values $T_E$ and/or voltage values $U_E$ that are to be anticipated. The high-frequency value HFW, the temperature values $T_E$, and/or the voltage values $U_E$ may be compared with suitable limit values.

The result of the comparison is transferred to a monitor unit 24 that, for example, by the transmission and transfer of suitable control values SW within the framework of an on-line check, communicates, for example, with the measurement control unit 11 in order, accordingly, to monitor the transmission of the excitation high-frequency pulses HFS during the later magnetic resonance measurement MR. The test unit 20 is connected via an interface 25, for example, to the terminal interface 17, such that such a test phase TP may also be initiated by an operator directly from the terminal 30. The monitor unit 24 may, as appropriate, also transfer possible control or monitoring values via this interface 25 and the terminal interface 17 to the terminal 30 or to another computer that, for example, has a control sequence determination unit 33, in which offline (e.g., before a measurement), suitable optimized control sequences for a subsequent magnetic resonance measurement are determined. The control and monitoring values determined by the test unit 20, in order to provide that the limit values are maintained at the local coil arrangements 5, may be taken into account by the control sequence determination unit 33 at the same time as the pulse calculation for the control sequence AS.

For example, the test unit 20 may also be used to transmit a calibration high-frequency pulse KS in the calibration phase. The calculation of the calibration values K may take place in the analysis unit 23. The test unit 20, with various different components and interfaces, may be realized, for example, in the form of software on a suitable processor of the control device 10. In one embodiment, such a test unit 20 may be arranged in the form of hardware components (e.g., by field-programmable gate arrays (FPGAs)).

Figure 4:
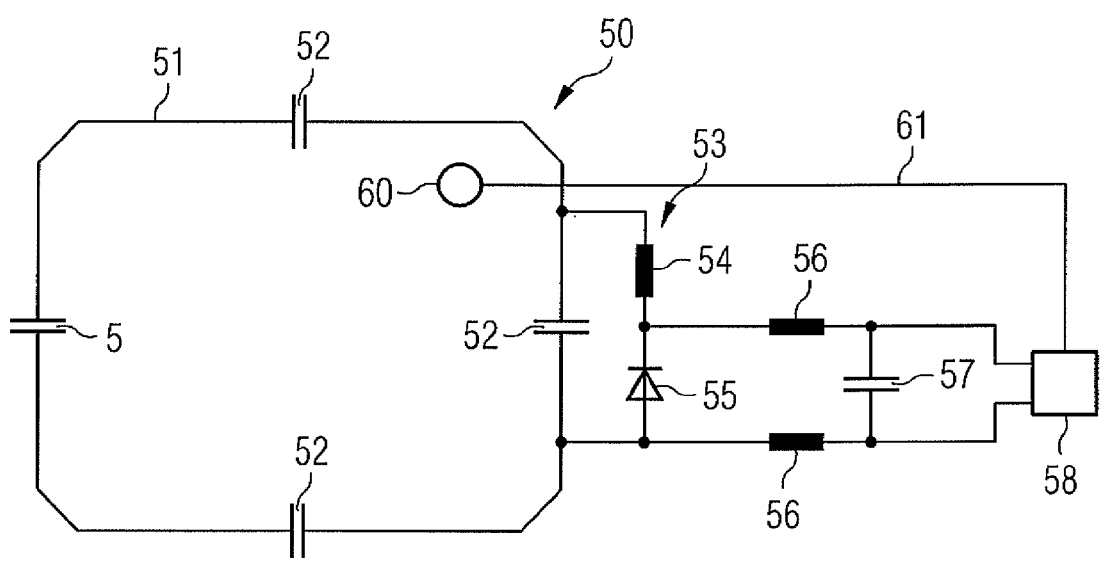
FIG. 4 shows one embodiment of a magnetic resonance antenna element of a local coil with an additional test antenna element for carrying out the method.

FIG. 4 shows one embodiment of a magnetic resonance antenna element 50 in a local coil that is also embodied with a test antenna element 60 in the form of a small conductor loop. The test antenna element 60 is connected by a lead 61 to a coil plug 58. With the aid of such a test antenna element, the high-frequency field present on the spot and of the local coil may be measured in order to carry out the method according. In addition, such a test antenna element may also be used in order to check the high-frequency field values locally online during the later measurement and in this way, to gain additional security that no limit values are exceeded.

In order, with the magnetic resonance antenna elements, to make the current transmission field at the current transmission of a test high-frequency pulse possible without reciprocal effect on the transmission field, preamplifiers that are coupled to the magnetic resonance antenna elements such that input impedance suppresses a current flow in the magnetic resonance antenna element as strongly as possible, may be used. This technique is also referred to as preamp decoupling. In this situation, the input impedance of the preamplifier is switched such that when connected to the magnetic resonance antenna element of the local coil, a high-resistance point is created in the plane of the antenna conductor. As a result, the current flow in the antenna is largely suppressed, with the result than an external field induces a voltage in the preamplifier but only a low current in the antenna. The antenna element therefore creates, on the basis of the induction of the transmission field, a field with very low field strength, and therefore does not contribute to the distortion of the transmission field.

The arrangements described above and below are only exemplary embodiments, and the basic principles may be varied within broad ranges by the person skilled in the art without leaving the scope of the invention. For example, the variants of the method and devices (e.g., the arrangement of the magnetic resonance antenna elements and of the test antenna elements in and at the local coils respectively) may also be used in any desired combinations with one another.

In the exemplary embodiments described above, it is assumed that the high-frequency field is always transmitted from the whole-body coil of the magnetic resonance system. However, the transmission field for the excitation of nuclear spins may be produced by local coils. With the method of the present embodiments, the effects of the high-frequency field on the other local coils that, for example, are not transmitting at that moment may be determined. The use of the indefinite article "a" or "an" does not exclude the possibility that the features concerned may also be present in a plurality. The term "unit" does not exclude the possibility that the unit includes several components that may, if appropriate, also be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for the control of a magnetic resonance system, the magnetic resonance system comprising a transmitter antenna arrangement having a plurality of independent high-frequency transmitter channels, and a local coil arrangement arranged in the magnetic resonance system, the method comprising:

transmitting, with the transmitter antenna arrangement, a test high-frequency pulse with a plurality of parallel individual high-frequency pulses before a magnetic resonance measurement in a test phase, over the plurality of independent high-frequency transmitter channels, the test high-frequency pulse, with lower transmitter power of −60 to 20 dBm, generating essentially the same field distribution as an excitation high-frequency pulse to be transmitted during a subsequent magnetic resonance measurement;

measuring a high-frequency field created by the test high-frequency pulse in at least one area of the local coil arrangement;

determining a high-frequency field value that is to be anticipated during the subsequent magnetic resonance measurement at the local coil arrangement on the basis of the high-frequency field measured, and determining a temperature value to be anticipated by the high-frequency field at, in, or at and in the local coil arrangement; and controlling the magnetic resonance system during a later magnetic resonance measurement, the controlling comprising taking account of the high-frequency field value.

2. The method as claimed in claim 1, wherein measuring the high-frequency field comprises measuring the high-frequency field using a number of antenna elements arranged at the local coil arrangement, integrated in the local coil arrangement, or arranged at the local coil arrangement and integrated in the local coil arrangement.

3. The method as claimed in claim 2, wherein measuring the high-frequency field comprises measuring the high-frequency field using at least a portion of the antenna elements of the local coil arrangement.

4. The method as claimed in claim 1, wherein measuring the high-frequency field comprises measuring the high-frequency field using a number of test antenna elements.

5. The method as claimed in claim 1, wherein determining the high-frequency field value comprises determining a local high-frequency field amplitude.

6. The method as claimed in claim 1, wherein determining the high-frequency field value comprises determining a mean quadratic high-frequency field amplitude.

7. The method as claimed in claim 1, further comprising determining a voltage value to be anticipated.

8. The method as claimed in claim 1, further comprising calculating, on the basis of the high-frequency field value, a physical high-frequency load value of an examination object that is to be anticipated, caused by the transmitter field.

9. The method as claimed claim 1, further comprising transmitting, in the test phase, a test pulse sequence, the test pulse sequence comprising test high-frequency that correspond to at least one section of a pulse sequence to be transmitted in the later magnetic resonance measurement.

10. The method as claimed in claim 7, further comprising comparing the high-frequency field value, the temperature value, the voltage value, a physical high-frequency load value, or a combination thereof with a limit value; and restricting the later magnetic resonance measurement as a function of the comparison.

11. The method as claimed in claim 10, further comprising determining or modifying a pulse frequency for the later magnetic resonance measurement or another later magnetic resonance measurement as a function of the high-frequency field value, the voltage value, the temperature value, the physical high-frequency load value, the limit value, or a combination thereof.

12. The method as claimed claim 2, further comprising determining, before the test phase and in a calibration phase, calibration values, the determining comprising transmitting a calibration high-frequency pulse with known high-frequency field distribution for the antenna elements.

13. The method as claimed in claim 3, wherein measuring the high-frequency field comprises measuring the high-frequency field using a number of test antenna elements.

14. The method as claimed in claim 3, wherein determining the high-frequency field value comprises determining a local high-frequency field amplitude.

15. The method as claimed in claim 3, wherein determining the high-frequency field value comprises determining a mean quadratic high-frequency field amplitude.

16. The method as claimed in claim 3, further comprising determining a temperature value to be anticipated by the high-frequency field at, in, or at and in the local coil arrangement, a voltage value to be anticipated, or the temperature value and the voltage value.

17. The method as claimed in claim 3, further comprising calculating, on the basis of the high-frequency field value, a physical high-frequency load value of an examination object that is to be anticipated, caused by the transmitter field.

18. A control device for the control of a magnetic resonance system with a plurality of independent high-frequency transmitter channels and a local coil arrangement, wherein the control device is configured to transmit an excitation pulse with individual high-frequency pulses over various different high-frequency transmitter channels of the plurality of independent high-frequency transmitter channels in order to carry out a desired magnetic resonance measurement on the basis of a predetermined control sequence, the control device comprising:
a test unit comprising:
  a test signal transmitter interface operable, in a test phase before a magnetic resonance measurement, to initiate transmission of a test high-frequency pulse with at least a portion of the parallel individual high-frequency pulses over the various different high-frequency transmitter channels, the test high-frequency pulse, at lower transmitter power of −60 to 20 dBm, generating essentially the same field distribution as an excitation high-frequency pulse to be transmitted during a subsequent magnetic resonance measurement;
  a test value measurement interface operable, in the test phase, to initiate measurement of a high-frequency field generated by the test high-frequency pulse in at least one area of the local coil arrangement;
  an analysis unit operable to determine a high-frequency field value to be anticipated at the local coil arrangement during the subsequent magnetic resonance measurement on the basis of the high-frequency field measured, and operable to determine a temperature value to be anticipated by the high-frequency field at, in, or at and in the local coil arrangement; and
  a monitor unit configured to control the magnetic resonance system during a later magnetic resonance measurement by taking account of the high-frequency field value.

19. A magnetic resonance system comprising:
a plurality of independent high-frequency transmitter channels;
a basic field magnet system;
a transmitter antenna system comprising a plurality of independent high-frequency transmitter channels;
a local coil arrangement; and
a control device for the control of the magnetic resonance system, wherein the control device is configured to transmit an excitation pulse with individual high-frequency pulses over various different high-frequency transmitter channels of the plurality of independent high-frequency transmitter channels in order to carry out a desired magnetic resonance measurement on the basis of a predetermined control sequence, the control device comprising:
a test unit comprising:
  a test signal transmitter interface operable, in a test phase before a magnetic resonance measurement, to initiate transmission of a test high-frequency pulse with at least a portion of the parallel individual high-frequency pulses over the various different high-frequency transmitter channels, the test high-frequency pulse, at lower transmitter power of −60 to 20 dBm, generating essentially the same field distribution as an excitation high-frequency pulse to be transmitted during a subsequent magnetic resonance measurement;
  a test value measurement interface operable, in the test phase, to initiate measurement of a high-frequency field generated by the test high-frequency pulse in at least one area of the local coil arrangement;
  an analysis unit operable to determine a high-frequency field value to be anticipated at the local coil arrangement during the subsequent magnetic resonance measurement on the basis of the high-frequency field measured, and operable to determine a temperature value to be anticipated by the high-frequency field at, in, or at and in the local coil arrangement; and a monitor unit configured to control the magnetic resonance system during a later magnetic resonance measurement by taking account of the high-frequency field value.

20. In a non-transitory computer-readable storage medium that stores instructions executable by a control device of a magnetic resonance system to control the magnetic resonance system, the magnetic resonance system comprising a transmitter antenna arrangement having a plurality of independent high-frequency transmitter channels, and a local coil arrangement arranged in the magnetic resonance system, the instructions comprising:

transmitting, with the transmitter antenna arrangement, a test high-frequency pulse with a plurality of parallel individual high-frequency pulses before a magnetic resonance measurement in a test phase, over the plurality of independent high-frequency transmitter channels, the test high-frequency pulse, with lower transmitter power of −60 to 20 dBm, generating essentially the same field distribution as an excitation high-frequency pulse to be transmitted during a subsequent magnetic resonance measurement;

measuring a high-frequency field created by the test high-frequency pulse in at least one area of the local coil arrangement;

determining a high-frequency field value that is to be anticipated during the subsequent magnetic resonance measurement at the local coil arrangement on the basis of the high-frequency field measured, and determining a temperature value to be anticipated by the high-frequency field at, in, or at and in the local coil arrangement; and controlling the magnetic resonance system during a later magnetic resonance measurement, the controlling comprising taking account of the high-frequency field value.

21. The method as claimed in claim 1, wherein the controlling comprises controlling the magnetic resonance system during the later magnetic resonance measurement taking account of the high-frequency field value and the temperature value.

\* \* \* \* \*